United States Patent [19]
Sheer et al.

[11] 3,931,542
[45] Jan. 6, 1976

[54] METHOD AND APPARATUS FOR ENERGIZING MATERIALS IN AN ELECTRIC ARC

[75] Inventors: Charles Sheer, Teaneck, N.J.;
Samuel Korman, Hewlett, N.Y.;
Derek J. Angier, Somerville, N.J.

[73] Assignee: Sheer-Korman Associates, Inc., New York, N.Y.

[22] Filed: Jan. 3, 1975

[21] Appl. No.: 538,361

Related U.S. Application Data

[63] Continuation of Ser. No. 374,519, June 28, 1973, abandoned, which is a continuation-in-part of Ser. No. 165,473, July 26, 1971, abandoned.

[52] U.S. Cl. ........ 315/111.2; 219/121 P; 313/231.4
[51] Int. Cl.² ...................... H01J 17/30; H05H 1/00
[58] Field of Search ......... 315/111, 111.2; 313/231, 313/231.4; 219/121 P

[56] References Cited
UNITED STATES PATENTS

| | | | |
|---|---|---|---|
| 3,122,672 | 2/1964 | Sheer | 315/334 X |
| 3,644,782 | 2/1972 | Sheer et al. | 315/111 |
| 3,714,390 | 1/1973 | Foex et al. | 219/121 P |

*Primary Examiner*—Palmer C. Demeo
*Attorney, Agent, or Firm*—Hammond & Littell

[57] ABSTRACT

An improved apparatus and method for energizing materials in a free-burning electric arc is provided by radially disposing a plurality of anodes around an extension of the cathode axis. The anodes are inclined at an angle ranging from about 45° to about 135°. The current to each of the anodes is adjusted whereby the anode jets merge with the cathode jet to provide a unidirectional tail flame.

9 Claims, 2 Drawing Figures

METHOD AND APPARATUS FOR ENERGIZING MATERIALS IN AN ELECTRIC ARC

CROSS REFERENCES

This application is a continuation of copending application Ser. No. 374,519, filed June 28, 1973, now abandoned, which in turn was a continuation-in-part of Ser. No. 165,473, filed July 26, 1971, now abandoned.

BACKGROUND OF THE INVENTION

This invention relates to an improved method and apparatus for producing chemical and physical changes in substances by exposing them to the direct current of an electric arc. More particularly, the present invention relates to a method and apparatus for enhancing the stability of a free-burning electric arc into which various substances are forcefully injected to produce chemical and physical changes in those substances.

Various techniques are known for generating a continuous stream of plasma by means of an electric arc. As would be expected, there are practical problems associated with each technique for generating the plasma. Moreover, each method of generation affects the character of the plasma produced. Utilization of the plasma to bring about physical and chemical changes in various substances is even more complex.

A novel and very effective technique for efficiently energizing reactant materials in the conduction column of a free-burning electric arc involves forcefully injecting a substance along a cathode having a conical tip, into the contraction zone of the conduction column. This technique takes advantage of the so-called cathode jet effect due to the contraction of the arc column near the cathode. In effect, under the right conditions the plasma moves away from the cathode with a concomitant decrease in the pressure at the base of the contraction zone so that the arc in this region aspirates gas from the surrounding atmosphere to form a continuous cathode jet. The contraction zone serves as an "injection window" across which materials may be injected directly into the arc column at substantially improved flow rates without disturbing the stability of the arc by virtue of the forced convection to which it is subjected. This is particularly true when the anode and cathode are directly opposed in a co-linear configuration.

Unfortunately, opposing such a cathode and anode in a co-linear configuration presents myriad of operational problems which must be overcome in order to achieve a commercially reliable process involving the use of an electric arc to promote chemical and physical changes. For example, when the cathode jet is allowed to impinge directly on a non-consumable solid anode the anode displays excessive wear and high heat losses are observed rendering the process generally inefficient. More importantly, if the material fed into the arc contains an entrained solid, the anode surface adjacent to and surrounding the anode spot, i.e., the area of the anode receiving the arc current, quickly becomes coated with a layer of solid. Deposition of the solid on the anode soon interferes with stable arc operation and contributes significantly to anode corrosion.

One technique employed in an attempt to overcome anode corrosion involves raising the current density at the anode spot sufficiently to vaporize the anode material thus generating a copious flow of vapor away from the anode spot. The anodes are consumed in this high intensity arc type of discharge.

In another high intensity arc type of discharge a porous anode is used through which a gas is transpirated to provide a continuous stream of gas away from the anode spot. These porous anodes used in this technique are referred to as fluid transpiration anodes.

Nothwithstanding the ability of the aformentioned technique to keep the anode spot clear of deposited material, extreme difficulty has been encountered with the high intensity mode of operation in controlling the arc effluent. When the anode and cathode are opposed in co-linear configuration, the arc effluent flares radially outward in all directions at the point where the two jets collide and hence a well defined unidirectional effluent jet is not obtained. When the cathode is inclined at a sufficiently large angle to the anode to allow the two jets to merge smoothly the arc column is enormously elongated and the effluent is not well defined. Moreover, when it is desired to quench the arc effluent, the jet of quench gas tends to interfere with the arc stability owing to the elongated column. Consequently, there is a need for improved methods and apparatus for energizing fluid materials in a plasma jet that efficiently utilize the energy of the arc while at the same time maximize arc stability.

SUMMARY OF THE INVENTION

In one aspect, the present invention provides improved means for energizing a fluid medium in the conduction column of a free-burning arc discharge. According to the present invention, a plurality of anodes are radially disposed around an extension of the cathode axis whereby the anode jets are merged smoothly with the cathode jet thus forming a single effluent stream along the extension of the cathode axis. The anodes are inclined at an angle ranging from about 45° to about 135° with respect to the cathode axis.

In a preferred embodiment of the present invention, three anodes are symmetrically arranged in a plane perpendicular to the extension of the cathode axis. Each anode is provided with a separate power source and the current to each anode is adjusted by suitable external controls to maintain the conduction column and tail flame as a substantially linear extension, along the cathode axis. In the case of a fluid transpiration anode, of course, the flow of working fluid will also be adjusted in addition to the current supplied to each electrode.

The anodes employed in the present invention may be solid non-consumable anodes, such as water cooled copper anodes, high intensity arc consumable anodes, such as carbon anodes, and porous non-consumable fluid transpiration anodes. It is particularly preferred in the present invention to use fluid transpiration anodes.

In yet another aspect of the present invention, a process is provided for energizing reactive materials by striking an arc between a cathode having a conical tip and a plurality of anodes radially disposed around an extension of the cathode axis. Next, the current to each of the anodes is adjusted to provide a substantially linear conduction column and tail flame. Thereafter reactive material is forcefully projected substantially parallel to the surface of the cathode through the contraction zone of the arc column whereby the desired unidirectional tail flame is obtained and the material fed into the column is immersed in hot plasma not only for the entire length of the arc column but also for the entire length of the tail flame.

DETAILED DESCRIPTION

Figure 1:
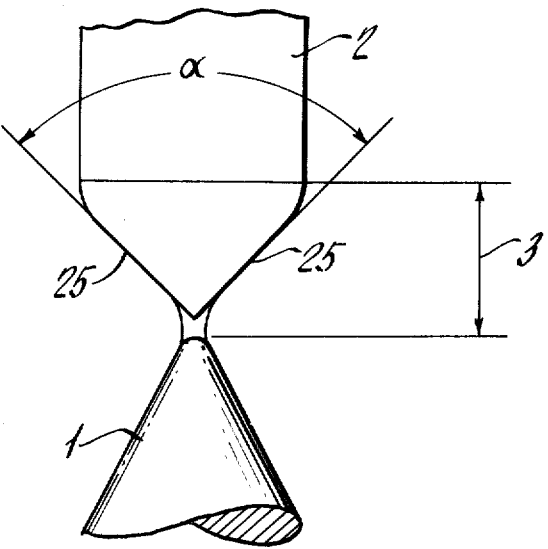
FIG. 1 is a schematic diagram illustrating the arc column contraction by the angle $\alpha$ in the vicinity of the cathode having a conical tip.

Referring to FIG. 1, when an arc is struck between an anode and a cathode having a conical tip there occurs a contraction in the current carrying area in the transition region beween the cathode 1 and the arc column proper 2. This contraction is indicated as contraction zone 3. The contraction of the current carrying area in the transition region between cathode 1 and column proper 2 may also be described by the angle $\alpha$ which is determined by extending lines into the column boundary at the points of inflection 25 on the boundary of the contraction zone. The angle $\alpha$ is a measure of the degree of contraction. This contraction causes the natural cathode jet effect as will be explained subsequently.

Referring to FIG. 1, the current density, and therefore the self-magnetic field due to the arc current increases toward the cathode as a result of the contraction of the current carrying area. This non-uniform magnetic field exerts a body force on the electrically conducting plasma propelling it in the direction of maximum decrease of the magnetic field, i.e. along the arc axis away from the cathode tip. The streaming of plasma away from the cathode tip decreases the local pressure in the immediate vicinity of the cathode tip which pressure decrease causess the arc to aspirate gas from the surrounding atmosphere. This mechanism establishes the well-known natural cathode jet effect. Such a jet has been observed to flow along the axis of the column away from cathodes having conical tips.

In view of the fact that there exists an inwardly directed pressure gradient in the vicinity of the cathode tip, contraction zone 3 can serve as an injection window through which materials may be injected directly into arc column 2. Indeed feed flow rates of a magnitude much greater than that aspirated naturally can be injected into the column through the injection without disturbing the stability of the arc by the vigorous forced convection.

Figure 2:
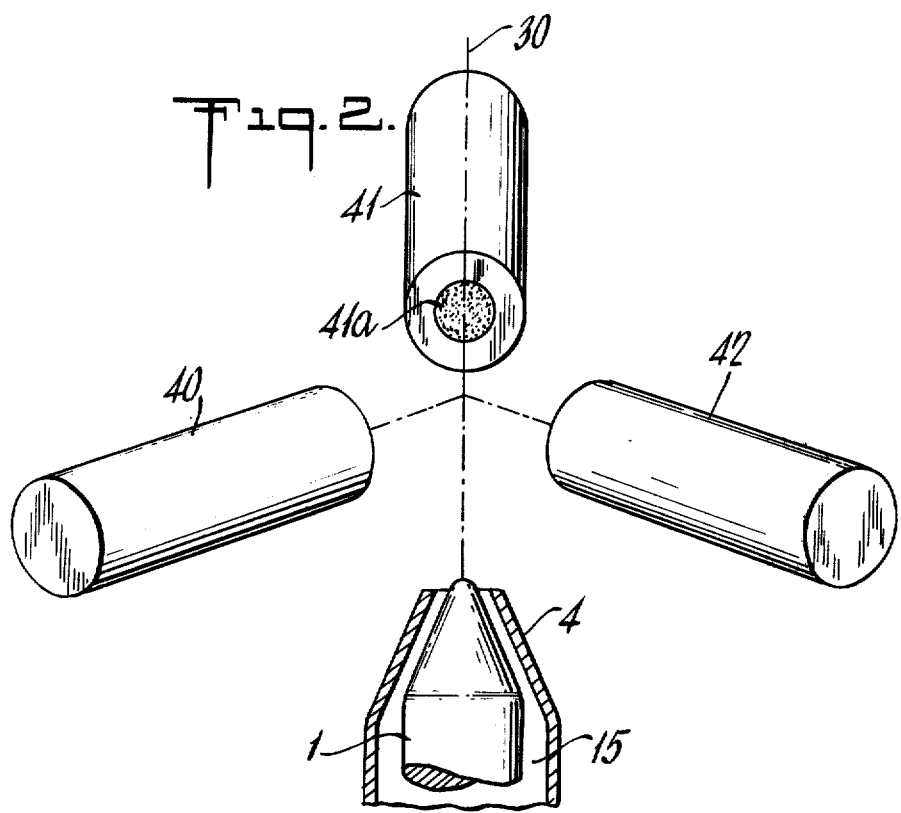
FIG. 2 is a schematic diagram illustrating the arrangement of three fluid transpiration anodes vis-a-vis an extension of the cathode axis in accordance with the present invention.

To provide a well defined conduction column and unidirectional tail flame into which a reactive material may be injected without disturbing the stability of the arc, it has been discovered that if a plurality of anodes are arranged radially around an extension of the cathode axis and the current to each anode is properly adjusted, the anode jets will merge smoothly with the cathode jet forming a single effluent stream along the extension of the cathode axis. Indeed when the anodes are in a plane perpendicular to an extension of the cathode axis, it has been discovered that very little cathode jet momentum is required to turn the anode jets through 90° causing them to merge smoothly with the cathode jet. Illustrative of this particular arrangement is FIG. 2 wherein three fluid transpiration anodes are arranged symmetrically in a plane perpendicular to an extension of the cathode axis shown as broken line 30. Separate power sources to each anode are not shown.

The anodes may be inclined at an angle ranging from about 45° to about 135° with respect to the cathode axis. At an anode inclination below about 45° the current conduction path increases requiring additional voltage and the effluent jet becomes more sensitive to the influence of quench gas. On the other hand at an anode inclination greater than about 135° the effluent jet flares outwardly losing the well defined unidirectional character. Consequently, it is particularly preferred to arrange the anodes symmetrically in a plane perpendicular to the extension of the cathode axis thereby achieving maximum control over the conduction column and tail flame character.

In operation of the process of the invention, an arc is struck between the anodes and cathode. The current to each anode is adjusted to provide a substantially linear conduction column. Thereafter reactive material is forcefully injected substantially parallel to the conical cathode surface into the injection window. Reactive material may be any gas which is capable of undergoing chemical reactions at the temperatures of the arc and may also include entrained, condensed material which is capable of undergoing physical and/or chemical changes at the temperature of the arc column. If fluid transpiration anodes are used, the flow of gas through each anode also is adjusted by suitable external controls, e.g., a metering valve for each anode.

In employing fluid transpiration anodes in the present invention, a reactive gas may be introduced into the arc through the porous anode surface. Optionally and preferably, however, a gas which is not chemically active at the prevailing anode temperatures is introduced through the porous anode surface. Typical of such gases are argon, helium, nitrogen and the like.

By use of the aforementioned technique many chemical and physical reactions can be conducted over long periods of time without detrimental effect to the anode surfaces. Moreover, the present arrangement permits operation of the arc over a wide range of cathode column lengths and flow rates, anode flow rates and arc power. Indeed, the arrangement has permitted operation of a free-burning arc even when heavy loads of refractory powder were contained in a feed gas and fed into the arc by projecting the solids in an entraining medium parallel the surface of the conical cathode and into the cathode column via the injection window.

As will be readily appreciated by those skilled in the art the present arrangement provides for increased residence time of materials in the hot plasma, since the material will remain in the plasma for the length of the cathode column and for the length of the tail flame.

Illustrative of the apparatus and method of the present invention is the following example. The device utilized in this example is shown diagrammatically in FIG. 2. It consists of a half inch copper rod containing a tungsten insert three/sixteenths of an inch in diameter in the form of a conical tip with a 45° cone angle as the cathode 1. Surrounding the cathode is a conical shroud 4 defining an annular passage 15. Shroud 4 also has a cone angle of 45° so that it mates with the conical surface of the cathode tip. Annular passage 15 is provided for the delivery of fluid material containing entrained solid along a path parallel to the surface of the conical tip into the contraction zone of the arc discharge. Shroud 4 is fabricated from copper and is provided with internal water cooling.

The anodes 40, 41 and 42 comprise a solid copper cylinder into which is inserted porous carbon plugs having an area of 1 cm$^2$. One such plug is shown as 41a. Means (not shown) are provided for injecting a gas into each of the anodes through the porous carbon surfaces and for metering and adjusting gas flow rates. Means are also provided for controlling the current to each anode.

The arc is ignited as follows:

1. An anode is brought into close proximity to the cathode. A moderate flow of gas is started. The arc is then ignited using a momentary high frequency spark to form a conductive path between the cathode and anode. With the main power supply turned on a rapid spark to arc transition occurs. The anode is retracted and the other two anodes are ignited in seriatum by bringing them into close proximity to the cathode. After igniting and retracting each anode to its desired operation position, the gas flow to each anode is adjusted to position the conduction column as near as possible in a vertical path equidistant from each anode.

2. Next the current to each anode is adjusted to further straighten the conduction column so that the central axis of the conduction column is substantially co-linear with the extension of the cathode axis.

3. Further trimming of gas flows and anode current are made if required to provide a stable condition.

4. When optimum conditions are obtained, that is, when the three anode jets are balanced and the cathode flow and arc current are set at a predetermined value, a solid material is entrained in the cathode fluid and introduced into the arc via annular passage 15. The amount of solid material entrained is kept initially low and slowly increased until the fraction of mass flow comprising the solid material is comparable to that of the cathode fluid.

The following parameters have been employed in starting and maintaining a stable operation of the arc:

| | | |
|---|---|---|
| Arc current | 50–750 amps | |
| Arc voltage | 50–165 volts | |
| Arc gap | 0.3–1.0 cm | (start-up) |
| | 8–20 cm | (operation) |
| Total mass flow of cathode fluid and entrained solid | 10–50 gm./min. | |

In some instances the anode currents were substantially equal. More often than not, however, the anode current supplied to each of the anodes varied considerably. For example, in one run the following currents were supplied to each of three anodes: 100 amps; 135 amps and 155 amps. Surprisingly, adjusting the anode currents had a profound effect on the positioning of the arc relative to the extension of the cathode axis. In order to assure that material projected through the injection window stays within the conduction column and tail flame for their entire length, the conduction column and tail flame must be co-linear with the cathode axis, i.e., the column must be "straight" and the tail flame unidirectional. If the column is inclined at an angle with respect to the cathode axis, the momentum of the material projected through the injection window is sufficient to carry the material out of the column. Adjusting the gas flows to the anodes does not have as dramatic an effect on straightening the arc column but advantage is taken of the ability to adjust gas flow with fluid transpiration anodes. Stable operation has been achieved with gas flows for each anode ranging from 18 grams/minute up to 37 grams/minute and undoubtedly other flows can be used.

What is claimed is:

1. Apparatus for energizing materials in a free-burning electric arc column comprising in combination: a cathode having a conical tip; at least three anodes radially disposed and substantially equally spaced around an extension of the cathode axis, said anodes being inclined at an angle of from about 45° to about 135° with respect to the cathode axis; means for individually adjusting the current to each anode; and means for forcefully projecting fluid material along a path parallel to the surface of the cathode and into and through the arc column.

2. The apparatus of claim 1 wherein three anodes are symmetrically arranged in a plane perpendicular to the extension of the cathode axis.

3. The apparatus of claim 1 wherein said anodes are fluid transpiration anodes.

4. The apparatus of claim 3 including means for adjusting the flow of fluids to each of the fluid transpiration anodes.

5. The apparatus of claim 1 wherein said anodes are non-consumable anodes.

6. The apparatus of claim 1 wherein said anodes are consumable high intensity arc anodes.

7. In the process of energizing materials by means of an arc discharge between an anode and cathode having a conical tip, the improvement comprising providing at least three anodes radially disposed and substantially equally spaced around an extension of the cathode axis at an angle ranging from about 45° to about 135° with respect to said axis; individually adjusting the current to each of the anodes to provide a conduction column which is co-linear with the cathode axis; forcefully projecting said material along a path parallel to the surface of the cathode into and through an arc column whereby a unidirectional tail flame is obtained and whereby said material is immersed in hot plasma throughout the length of the arc column and the length of the unidirectional tail flame.

8. In generating a free-burning electric arc, the improvement comprising: striking an arc between a cathode having a conical tip and at least three anodes radially disposed and substantially equally spaced around an extension of the cathode axis; thereafter individually adjusting the supply of current to each of said anodes whereby the anode jets merge smoothly with the cathode jet to provide an effluent column substantially co-linear with the cathode axis.

9. The process of claim 8 wherein three fluid transpiration anodes are symmetrically arranged in a plane perpendicular to an extension of cathode axis and the flow of working fluid to each of the anodes is individually adjusted.

* * * * *